United States Patent
Takehiro et al.

(10) Patent No.: US 6,403,441 B1
(45) Date of Patent: Jun. 11, 2002

(54) METHOD FOR FABRICATING STORAGE CAPACITOR USING HIGH DIELECTRIC CONSTANT MATERIAL

(75) Inventors: Shinobu Takehiro; Masaki Yoshimaru, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/291,306

(22) Filed: Apr. 15, 1999

(30) Foreign Application Priority Data

Jun. 30, 1998 (JP) .......................................... 10-183692

(51) Int. Cl.⁷ .................. H01L 21/20; H01L 29/76; H01L 29/94
(52) U.S. Cl. ..................... 438/396; 438/3; 438/240; 438/244; 438/253; 438/386; 257/306; 257/310
(58) Field of Search ................... 438/240, 396, 438/3, 244, 387, 253

(56) References Cited

U.S. PATENT DOCUMENTS

| | | | |
|---|---|---|---|
| 3,972,059 A | * 7/1976 | DiStefano | 357/6 |
| 5,789,268 A | * 8/1998 | Chivukula et al. | 437/60 |
| 5,807,774 A | 9/1998 | Desu et al. | |
| 6,010,744 A | * 1/2000 | Buskirk et al. | 427/81 |
| 6,025,257 A | * 2/2000 | Jeon | 438/608 |
| 6,078,072 A | * 6/2000 | Okudaira | 257/295 |

FOREIGN PATENT DOCUMENTS

| | | |
|---|---|---|
| JP | 7-86514 | 3/1995 |
| JP | 9-82915 | 3/1997 |
| JP | 9-246490 | 9/1997 |

OTHER PUBLICATIONS

Wolf et al. Silicon Processing for the VLSI Era, vol. 1, Lattice Press: Sunset Beach, CA, 1986, pp. 357–361.*

Mitsuaki Izuha et al., "Electrical Properties of All–Perovskite Oxide (SrRuO3/BaxSr1–xTiO3/SrRuO3)," Jpn. J. Appl. Phys. vol. 36 (1997) pp. 5866–5869, Part 1, No. 9B, Sep. 1997.

* cited by examiner

Primary Examiner—Olik Chaudhuri
Assistant Examiner—Erik J Kielin
(74) Attorney, Agent, or Firm—Volentine Francos, PLLC

(57) ABSTRACT

A method for manufacturing a semiconductor device by laminating a plurality of ruthenium-type conductive electrodes and a dielectric film having a perovskite structure, includes forming a first conductive electrode at the semiconductor substrate, forming a first area where elements constituting the first conductive electrodes and elements constituting a first dielectric film are melded, forming a transitional layer by performing a heat treatment on the first meld area within a non-oxidizing atmosphere and forming the first dielectric film on the first conductive electrode. Accordingly, a transitional layer having a consistent composition can be formed with a high degree of efficiency at the interface of the ruthenium-type electrode and the dielectric substance having a perovskite structure, so that a capacitor structure employing a very thin dielectric film having a high dielectric constant can be produced with ease and at low cost.

13 Claims, 15 Drawing Sheets

Dielectric film (BST)

Dielectric initial layer (BST layer)

Lower electrode (Ru)

unit (%)

| point | O | Si | Ti | Sr | Ru | Ba | position |
|---|---|---|---|---|---|---|---|
| A | 48.8 | — | 28.2 | 10.7 | — | 12.4 | upper BST |
| B | 48.7 | — | 27.8 | 11.6 | — | 12.0 | central BST |
| C | 48.9 | — | 29.6 | 11.1 | — | 10.5 | lower BST |
| D | 33.7 | — | 29.7 | 11.6 | 15.0 | 10.1 | BST initial layer |

US 6,403,441 B1

METHOD FOR FABRICATING STORAGE CAPACITOR USING HIGH DIELECTRIC CONSTANT MATERIAL

BACKGROUND OF THE INVENTION

1. Field of the Invention

The present invention relates to a method for manufacturing a semiconductor device, and more specifically, it relates to a method for manufacturing a semiconductor memory element having a capacitor such as a DRAM.

2. Description of the Related Art

Semiconductor memory devices that store data by accumulating an electrical charge at a capacitor electrode in the known art include dynamic random access memory (DRAM), ferroelectric random access memory (FRAM). Extensive research has been conducted into further miniaturization of memory cells in these semiconductor storage devices in order to respond to the need for assuring a larger capacity for storage and for achieving higher integration of elements in recent years.

However, when memory cells are miniaturized, a problem arises in that since the capacity of the capacitor becomes reduced due to reduced capacitor area, erroneous operation in data call-out may be caused by noise or the so-called leak current, i.e., the accumulated electrical charge flowing out in the area between the capacitor portion and the electrode, may occur, which will result in data being changed. In addition, there is another problem in that when memory cells are more miniaturized, it becomes difficult to assure a sufficient capacitor capacity simply by forming a capacitor on the gate electrode.

As a means for addressing these problems, a method has been proposed whereby an insulating film material having a high dielectric constant is used as the capacitor insulating film. For instance, application of crystal having a perovskite crystal structure such as barium titanate strontium (Ba, Sr)$TiO_3$: hereafter abbreviated to BST) which has a higher dielectric constant compared to those of $SiO_2$ films and $Si_3N_4$ films by a factor of several tens as capacitor films in semiconductor memories such as DRAM described above, has been considered.

FIG. 10 illustrates a common method for manufacturing a DRAM using a film with a high dielectric constant such as a BST film. Namely, first, as illustrated in FIG. 10(a), after forming an n-type diffusion layer area 2 on, for instance, a p-type silicon substrate 1 through an ion implantation method, an oxide film is deposited through, for instance, the CVD (chemical vapor-phase epitaxy) method to form a layer insulating film 3. Next, by employing the photolithography method and dry etching technology, a contact hole passing through to the n-type diffusion layer 2 is formed, and following this step, a polycrystal silicon plug 4 is formed by doping phosphorus within the contact hole.

Then, as illustrated in FIG. 10(b), a barrier metal film (e.g., Ti, TiN) 5 and a capacitor lower electrode film (e.g., Ru) 6 are sequentially formed through sputtering, and by employing regular photolithography and etching technologies, a barrier metal 5 and a capacitor lower electrode 6 are formed.

Then, after forming a dielectric film (e.g., a BST film) 7 through, for instance, sputtering, a capacitor upper electrode (e.g., Ru) 8 is formed through sputtering, thereby completing the production of the memory capacitor portion of the DRAM, as illustrated in FIG. 10(c).

However, it has been confirmed that a phenomenon in which the dielectric constant of the dielectric film 7, which should be high, becomes reduced, occurs if the film thickness of the dielectric film 7 is reduced relative to that in the prior art in the method commonly adopted in the prior art described above. This phenomenon is considered to be the result of a particular state of the interfaces between the dielectric film 7 and the lower electrode 6 and between the dielectric film 7 and the upper electrode 8. As a means for achieving a good interface state by addressing this problem, the following methods for manufacturing a capacitor portion have been disclosed.

For instance, Japanese Unexamined Patent Publication No. 1997-82915 discloses a method for manufacturing a capacitor portion with good interfaces formed therein by performing a heat treatment after forming the upper electrode film or the lower electrode film on the film having a high dielectric constant. Namely, as illustrated in FIG. 11(a), first, element isolation areas 32 are formed on a p-type single crystal silicon substrate 31 and then after forming a thermally oxidized film and a polycrystal silicon film on the single crystal silicon substrate a gate electrode is formed 33. Next, after forming n-type diffusion areas 34 and 35 through ion implantation, a layer insulating film 36 which is constituted of an oxide film is formed. In the next step, contact holes which pass through to the n-type diffusion areas are formed at the layer insulating film 36, and a polycrystal silicon film 37 is formed inside a contact hole and an impurity such as phosphorus is added. Then, a tungsten silicide film is deposited and a bit line 38 is formed by adopting the photolithography and etching technologies. Next, an oxide film is deposited through the CVD method to form a layer insulating film 39, and then a polycrystal silicon film 40 containing arsenic is formed inside a contact hole and on the layer insulating film 39 and the polycrystal silicon film 40 is made to fill inside the contact hole.

Then, as illustrated in FIG. 11(b), after depositing a ruthenium film, a capacitor lower electrode 41 is formed. Next, as illustrated in FIG. 11(c), an amorphous BST film 42 is formed. In the following step, as illustrated in FIG. 11(d), a heat treatment is performed within an oxygen atmosphere at a temperature of, for instance, 700 centigrade to form a ruthenium oxide film 43 at the surface of the ruthenium film 41, thereby forming a good interface for the ruthenium film 41 and the BST film.

In addition, in Jpn. J. Appl. Phys. Vol. 36 (1997), a method for maintaining a good state for the interface between an electrode film and a BST film which is formed above the electrode film by using an oxide conductor having a perovskite crystal structure such as $BaRuO_3$, $SrRuO_3$ or the like to constitute the electrode. Namely, since, if a BST film is formed on a metal electrode such as Pt, a layer with a low dielectric constant is formed at the interface of the electrode and the BST film to reduce the dielectric constant, adoption of an oxide electrode having a perovskite crystal structure which will not form such a low dielectric constant layer is proposed. Furthermore, since the lattice constant of the oxide having such a perovskite crystal structure is very close to the lattice constant of the BST film which also has a perovskite crystal structure, their crystal lattices can achieve a better match when the BST film is formed on the perovskite oxide electrode, which makes it possible to maintain a good state for the interface between the BST film and the electrode. An even better interface condition can be achieved by improving the matching of the crystal lattices through the use of a single crystal BST film without any torsion in the lattice.

However, the structure disclosed in Japanese Unexamined Patent Publication No. 1997-82915 presents a problem in that since the elements constituting the BST film and the ruthenium electrode are made to solid dissolve only through a mutual diffusion achieved by the heat treatment, the heat treatment must be implemented at a high temperature of approximately 700 centigrade in an oxygen atmosphere, which results in the ruthenium electrode and the barrier metal (e.g., TiN) formed under the ruthenium electrode becoming oxidized to an excessive degree. This causes the conductivity of the electrode to become degraded, to reduce the apparent dielectric constant of the dielectric substance. In addition, since the coefficients of diffusion of the various elements constituting the BST film and the ruthenium electrode are different from one another, a transitional layer with an inconsistent composition is formed if the elements are caused to dissolve only through a mutual diffusion effected by the heat treatment. In particular, titanium oxide ($TiO_2$) with a low dielectric constant will be formed in the transitional layer area having a composition with high Ti content, to reduce the apparent dielectric constant of the dielectric substance.

In addition, the structure disclosed in Jpn. J. Appl. Phys. Vol. 36 (1997) presents a problem in that it is extremely difficult to process the conductive material having a perovskite crystal structure which is used to constitute the electrode (e.g. $BaRuO_3$, $SrRuO_3$) through the dry etching technology. Namely, when an electrode material such as $BaRuO_3$, $SrRuO_3$ or the like is etched, a reaction product having a high melting point (namely, a halogen compound containing Ba or Sr) will be formed, which will not readily detach from the surface of the substance. For instance, $BaCl_2$ and $SrCl_2$ produced as a result of etching conductive materials such as $BaRuO_3$ and $SrRuO_3$ have extremely high melting points of 963 centigrade and 875 centigrade respectively, to present great difficulty in processing through the dry etching technology.

SUMMARY OF THE INVENTION

An object of the present invention, which has been completed by addressing the problems of the prior art discussed above, is to provide a new and improved method for manufacturing a semiconductor device through which a capacitor structure using a very thin dielectric film with a high dielectric constant can be manufactured with ease and at low cost by forming a transitional layer with a consistent composition at an interface of a ruthenium-type electrode and a dielectric substance having a perovskite structure with a high degree of efficiency.

In order to achieve the object described above, according to the present invention, a method for manufacturing a semiconductor device achieved by laminating a plurality of conductive electrodes constituted of at least one type of material selected from a group of high melting point noble metals comprising platinum, iridium and ruthenium, and a dielectric film constituted of a film with a high dielectric constant, e.g., a dielectric film having a perovskite structure, that comprises a step in which a first conductive electrode is formed, a step in which a first area where elements constituting the first conductive electrode and elements constituting a first dielectric film are melded is formed, a step in which a transitional layer is formed by performing a heat treatment on the first area where the elements are melded and a step in which the first dielectric film is formed on the first conductive electrode, is provided.

By adopting this structure, in which the area where the elements constituting the dielectric film and the elements constituting the lower electrode are melded is provided between the dielectric film and the lower electrode, a good transitional layer constituted of an oxide layer ($Ba_xSr_yRu_zTi_wO_3$ layer) can be achieved simply through the mutual diffusion effected by a heat treatment performed at a relatively low temperature. As a result, even when an extremely thin highly dielectric film is used, the leak current from the dielectric film is reduced to achieve good dielectric film characteristics. In addition, since this transitional layer is formed on the lower electrode while aligning itself on the lower electrode, the lower electrode, which corresponds to the $SrRuO_3$ layer in the prior art can be formed easily. Thus, the dry etching step, which is required in the method in the prior art, can be omitted to achieve simplification in the manufacturing process which, in turn, will reduce the production costs and improve the yield.

In addition, since the sputtering quantities for the individual elements constituting the dielectric film, which is driven into the lower electrode can be varied in correspondence to the power of the high-frequency voltage applied to the semiconductor substrate by, for instance, forming the meld area while applying a high-frequency voltage to the semiconductor substrate where the conductive electrode is formed and forming a dielectric layer on the conductive electrode, control over the composition of the meld area is achieved.

Furthermore, a fully oxidized transitional layer can be formed by, for instance, forming the meld area within an oxidizing atmosphere in which the oxygen concentration within the gas composition is increased so that the oxygen content in the meld area can be increased. In addition, by adding a step in which a first conductive oxide film is formed on the first conductive electrode after the step in which the first conductive electrode is formed, a conductive oxide film ($RuO_2$) which is an oxide of the lower electrode (e.g., Ru) can be formed at the front surface of the lower electrode and, as a result, the oxygen content in the meld area can be increased by achieving a fully oxidized transitional layer.

Moreover, by adding a step in which the elements constituting the dielectric substance are ion-implanted at the conductive electrode for the formation of the meld area, the elements constituting the dielectric film can be melded into the surface of the lower electrode in great quantities with better control compared to the method in which a high-frequency voltage is applied to the semiconductor substrate.

In addition, by forming the transitional layer through a heat treatment performed in a non-oxidizing atmosphere, excessive oxidation does not occur at the lower electrode and the barrier metal so that a good transitional layer constituted of an oxide layer ($Ba_xSr_yRu_zTi_wO_3$ layer) is achieved. Furthermore, if the heat treatment is performed at a low temperature of 500 centigrade or lower, a good transitional layer is formed since the lower electrode will not be oxidized even within the oxidizing atmosphere.

Moreover, by adding, for instance, a step in which a second dielectric film is formed on the first dielectric film which has been formed on the semiconductor substrate, a step in which a second area where the elements constituting the second dielectric film and the elements constituting the second conductive electrode are melded is formed, a step in which a transitional layer is formed by performing a heat treatment on the second meld area within a non-oxidizing atmosphere and a step in which a second conductive film is formed on the second dielectric film, a good interface is formed between the upper electrode and the dielectric film in addition to the interface between the lower electrode and the dielectric film. Thus, compared to the method for forming a good interface only between the dielectric film and the lower electrode, a further improvement is achieved in the capability for accumulating an electrical charge, and in particular, a capacitor having an extremely high capacity can be achieved even when the film thickness of the dielectric film is greatly reduced.

In addition, by adding, for instance, a step in which the upper electrode is formed on the second dielectric film while a high-frequency voltage is applied to the semiconductor substrate at which the second dielectric film has been formed in the formation of the second meld area, the sputtering quantities for the individual elements constituting the electrode that is driven into the second dielectric film can be varied in correspondence to the power of the high-frequency voltage applied to the semiconductor substrate, to achieve control over the composition of the meld area. Furthermore, by implementing this step in an oxidizing atmosphere with a higher oxygen concentration within the gas composition, the oxygen content in a specific meld area corresponding to the electrode film initial layer can be increased by achieving a more oxidized transitional layer.

Moreover, by performing a step in which the elements constituting the upper electrode are ion implanted onto the second dielectric film for the formation of the second meld area, the elements constituting the upper electrode can be melded into the surface of the dielectric film through the ion implantation technology and, as a result, compared to the method in which a high-frequency voltage is applied to the semiconductor substrate, the elements constituting the upper electrode can be melded into the surface of the dielectric substance in great quantities with better control.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the preferred embodiments of the method for manufacturing a semiconductor device according to the present invention, which is adopted in a method for manufacturing a DRAM having a capacitor structure. It is to be noted that in the following explanation and the attached drawings, the same reference numbers are assigned to members having essentially the same functions and structural features to preclude the necessity for repeated explanation thereof.

(First Embodiment)

Figure 1:
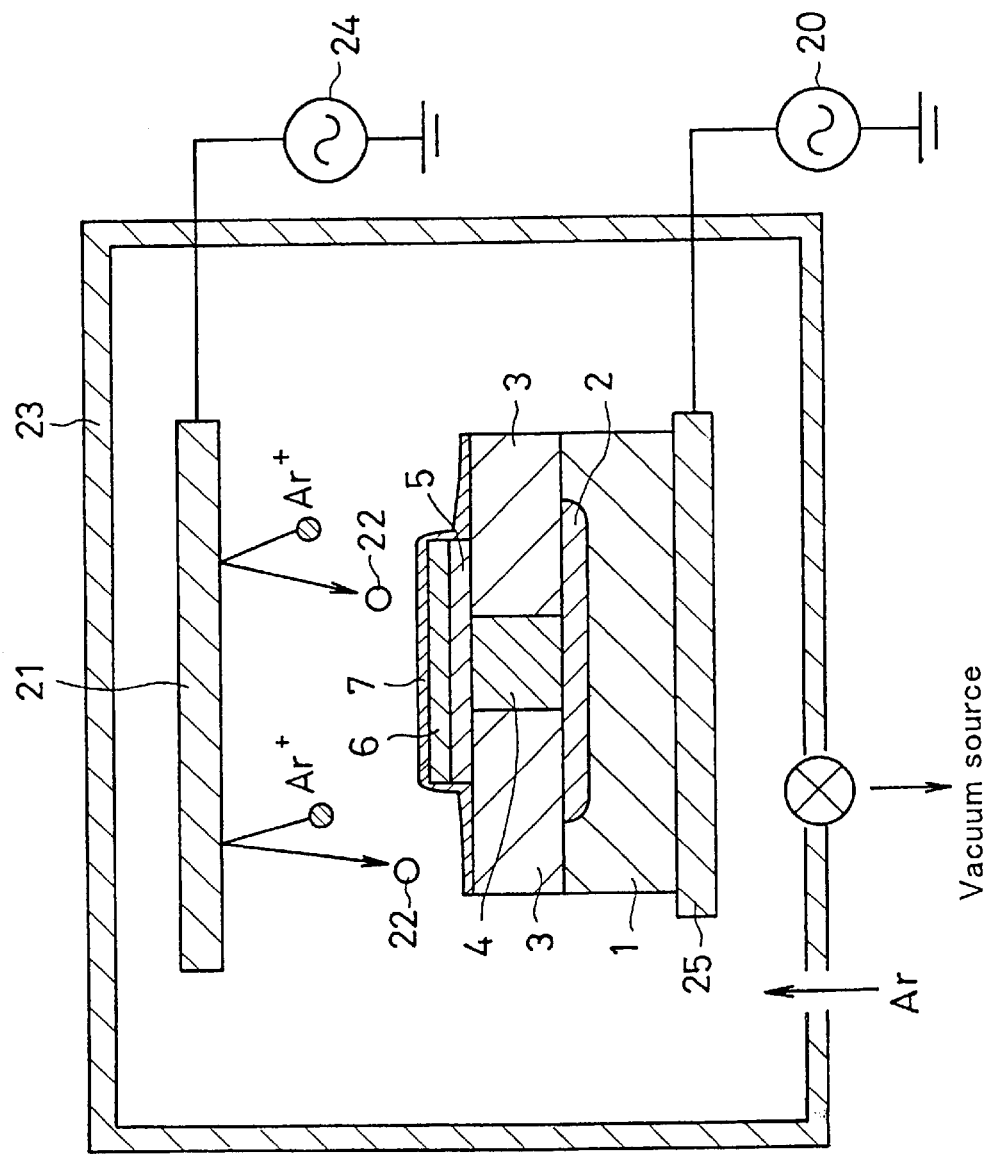
FIG. 1 is a cross section illustrating the structure of a sputtering apparatus employed in the method for manufacturing a semiconductor device in an embodiment of the present invention.

A schematic view of a sputtering apparatus used in this embodiment is presented in FIG. 1. In FIG. 1, the sputtering apparatus comprises high frequency sources 20 and 24, a target 21, a chamber 23, a sample holder 25 and the like. In addition, the high frequency (e.g. 13.56 MHz) source 24 is connected to the target 21, whereas the high frequency (e.g. 13.56 MHz) source 20 is connected to the sample holder 25. When argon ions (Ar$^+$) are driven into the target 21, sputter particles 22 are ejected from the target 21 to be deposited on the semiconductor device mounted on the sample holder 25, thereby forming a thin film.

Next, in reference to FIG. 2, the method for manufacturing a DRAM in the first embodiment is explained. First, as illustrated in FIG.2(a) an n-type diffusion area 2 is formed on, for instance, a p-type silicon substrate 1 through ion implantation, and then, a layer insulating film 3 having a film thickness of 100 nm~1000 nm is formed through, for instance, the CVD method. Next, a contact hole passing through to the n-type diffusion area 2 is formed and a polycrystal silicon plug 4 is formed by doping phosphorus inside the contact hole. Next, a barrier metal film 5 (e.g., TiN) having a film thickness of 10 nm~100 nm and a ruthenium-type lower electrode film (eg, Ru) 6 having a film thickness within the range of 30 nm~500 nm are sequentially deposited through sputtering, and then a lower electrode 6 of the capacitor is formed by adopting photolithography and etching technologies. Thus, a structure in which the lower electrode 6 and the barrier metal 5 are connected with the diffusion layer 2 formed on the silicon substrate 1 via the silicon plug 4 is completed. It is to be noted that this is similar to the manufacturing methods in the prior art.

Figure 2A:
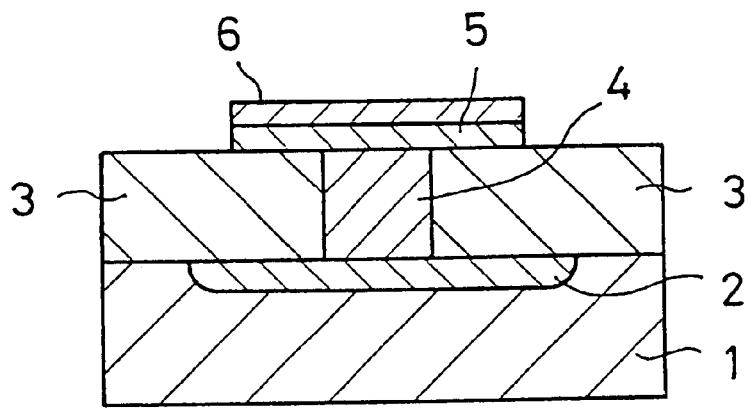
FIGS. 2(a)–2(d) present schematic cross sections illustrating the process for manufacturing a DRAM in a first embodiment of the present invention.
Figure 2B:
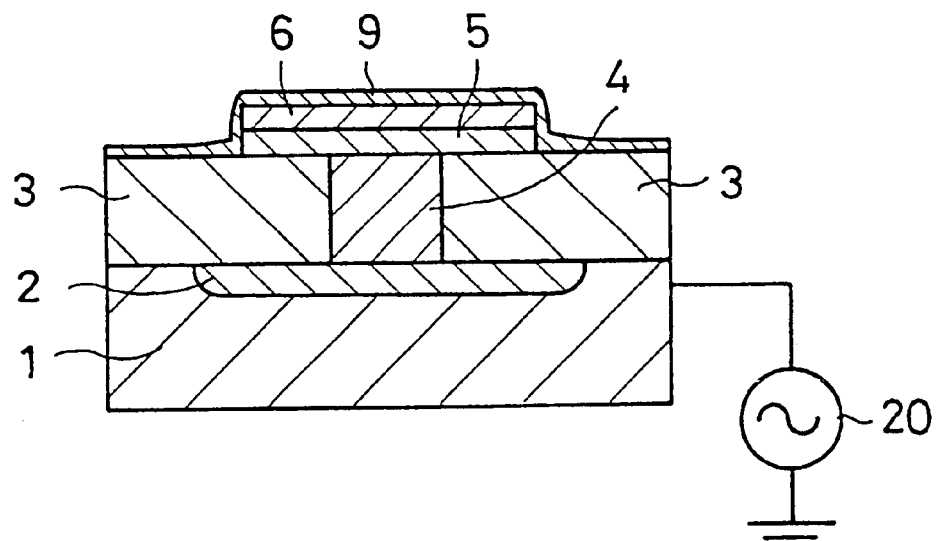

In the following step, as illustrated in FIG. 2(b), a high-frequency voltage is applied by the high frequency source 20 to the silicon substrate 1 on which the treatment described above has been performed to form a dielectric initial layer (e.g., BST layer) 9 having a film thickness of 10 nm and a perovskite structure on the lower electrode 6 and the layer insulating film 3 exposed at the surface of the silicon substrate 1 by adopting film formation technologies such as sputtering and the CVD method.

When the dielectric initial layer 9 is formed by applying a high-frequency voltage to the silicon substrate in this manner, a voltage that is negative relative to the plasma potential is applied to the silicon substrate 1. As a result, Ar ions and O ions enter the silicon substrate 1, and further, Ba ions, Sr ions and Ti ions which are the elements constituting the dielectric initial layer 9 enter the silicon substrate 1. This, in turn, causes the dielectric initial layer 9 and the lower electrode 6 deposited on the silicon substrate 1 to become reverse sputtered, the Ba ions, the Sr ions and the Ti ions of the elements constituting the dielectric initial layer 9 are driven into the lower electrode 6. Thus, a state in which the elements constituting the dielectric initial layer 9 are melded is achieved at the surface of the lower electrode 6.

Figure 3:
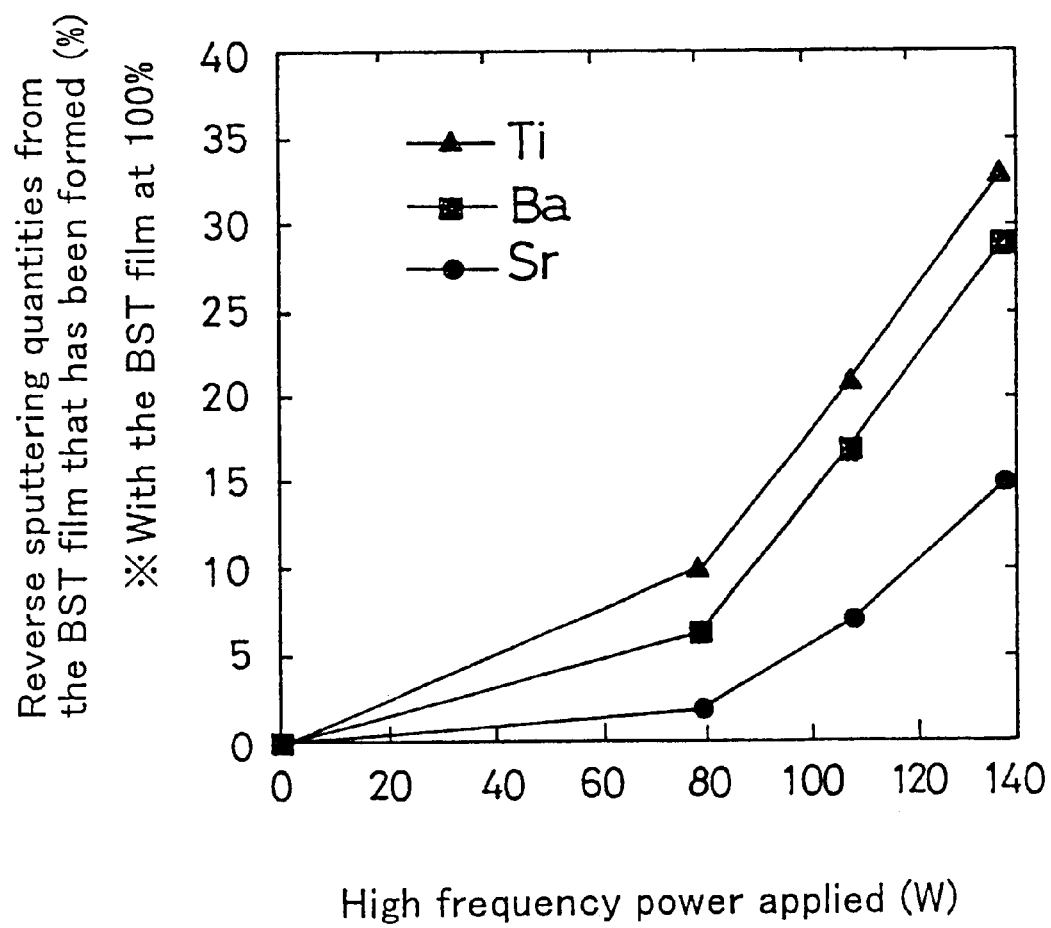
FIG. 3 illustrates the relationship between the high-frequency voltage applied during the formation of the dielectric film and the reverse sputtering quantities of the individual elements in the first embodiment of the present invention.

FIG. 3 illustrates the relationship between the reverse sputtering quantities of the individual elements constituting the dielectric initial layer 9 (Ba, Sr, Ti) driven into the silicon substrate 1 and the high-frequency voltage applied to the silicon substrate 1. In FIG. 3, as the high-frequency voltage applied to the silicon substrate 1 increases, the reverse sputtering quantities of the individual elements constituting the dielectric initial layer 9 also increase. In addition, since the reverse sputtering quantities of the elements constituting the dielectric initial layer 9 increase in the order of Ti>Ba>Sr, Ti becomes detached from the dielectric initial layer 9 in the greatest quantity and Sr becomes detached from the dielectric initial layer 9 in the smallest quantity among the elements constituting the dielectric initial layer 9, to be driven into the silicon substrate 1. Thus, the dielectric film 9 at the initial stage has a low Ti content and a high Sr content.

Figures 4A, 4B:
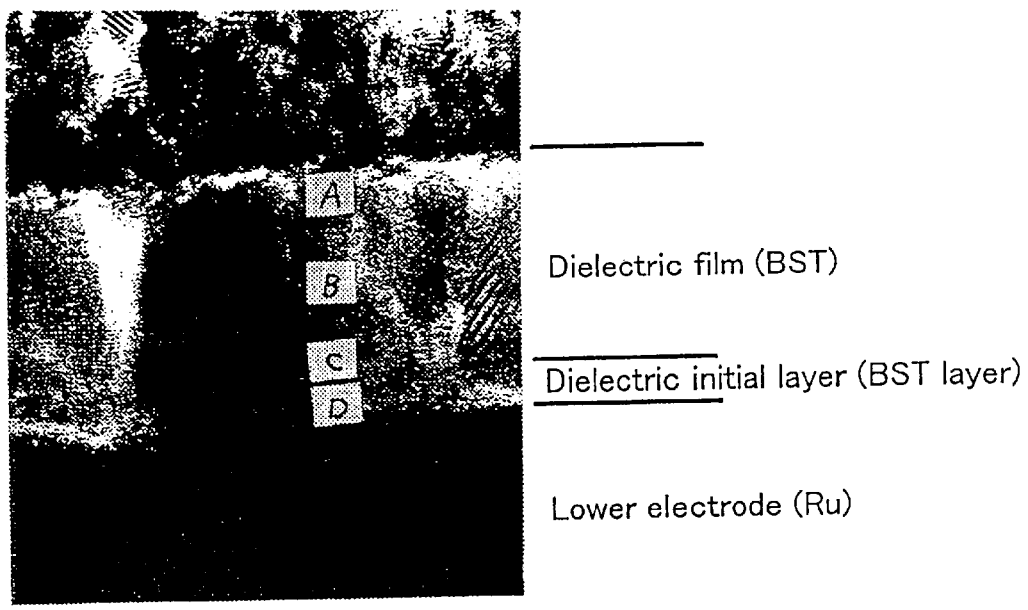
FIGS. 4(a) and 4(b) are respectively presents a photograph and a table showing the state of the initial layer formed during the formation of the dielectric film in the first embodiment of the present invention.

In addition, in regard to the depthwise compositional ratio of the dielectric initial layer 9 formed at the silicon substrate 1 by applying a high-frequency voltage of 80 W, Ru, which is an element constituting the lower electrode 6, is present at a ratio of approximately 15% in the dielectric initial layer 9 at the initial stage of the film formation (point D), as may be readily understood in view of FIGS. 4(a) and 4(b). Thus, by applying a high-frequency voltage to the silicon substrate 1, Ru can be melded into the dielectric initial layer 9. Furthermore, as the compositional quantities of Sr and Ru in the dielectric layer increase as the high-frequency voltage is raised, and ultimately, an $SrRuO_3$ film is formed during the initial stage of the formation of the dielectric initial layer 9.

Figure 5:
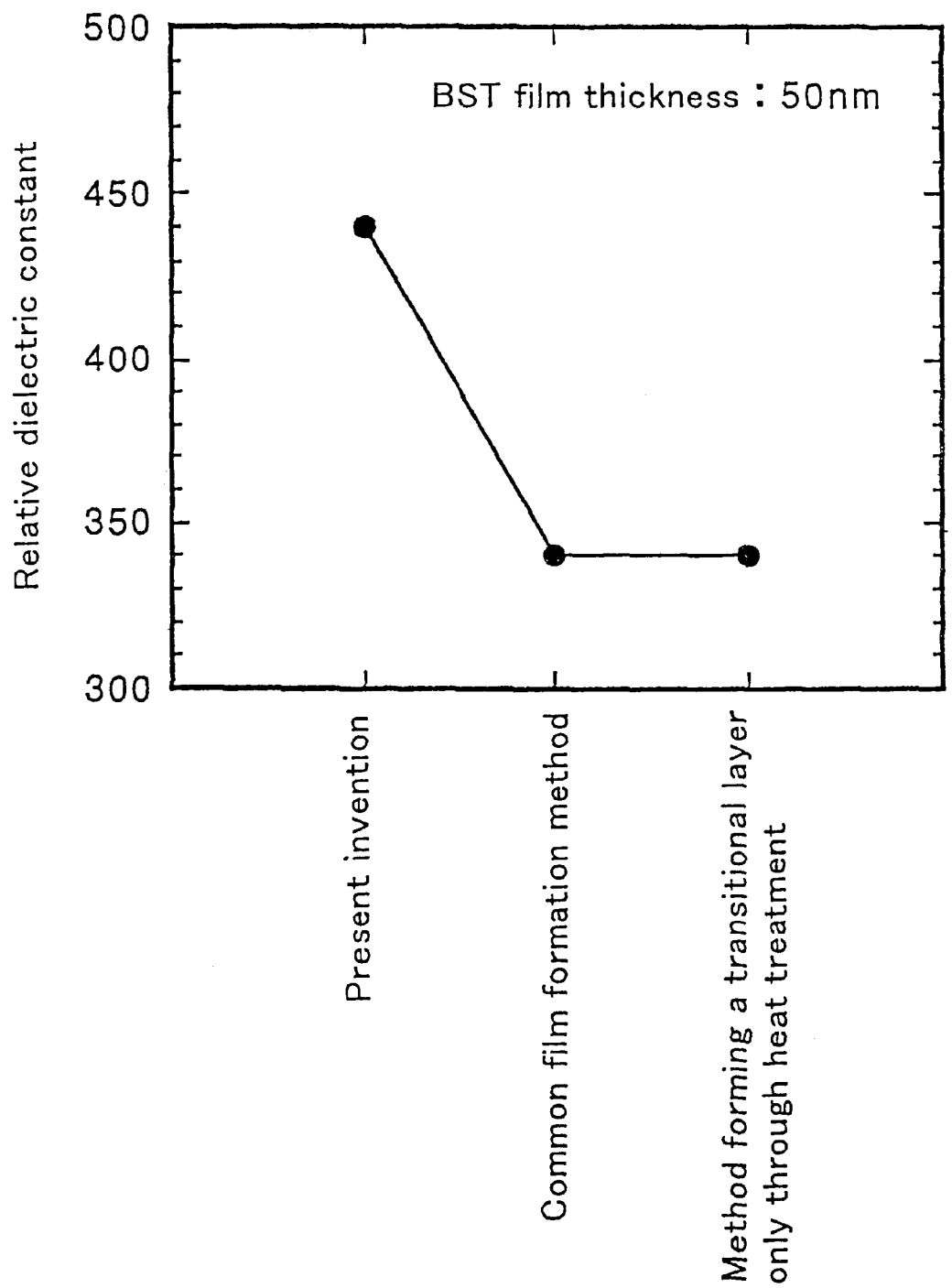
FIG. 5 illustrates a comparison of the dielectric constant of the dielectric initial layer formed through the method in the embodiment of the present invention and the dielectric constants of BST layers formed through other film formation methods.

Now, FIG. 5 presents the relative dielectric constants of the dielectric initial layer (BST layer) 9 formed by adopting the method in this embodiment, of a BST layer formed through a common film formation method and of a BST layer formed by adopting the method in which a transitional layer is formed through a heat treatment (Japanese Unexamined Patent Publication No. 1997-82915). As FIG. 5 indicates, the BST layer formed through the method in this embodiment of the present invention achieves the highest dielectric constant.

Figure 2C:
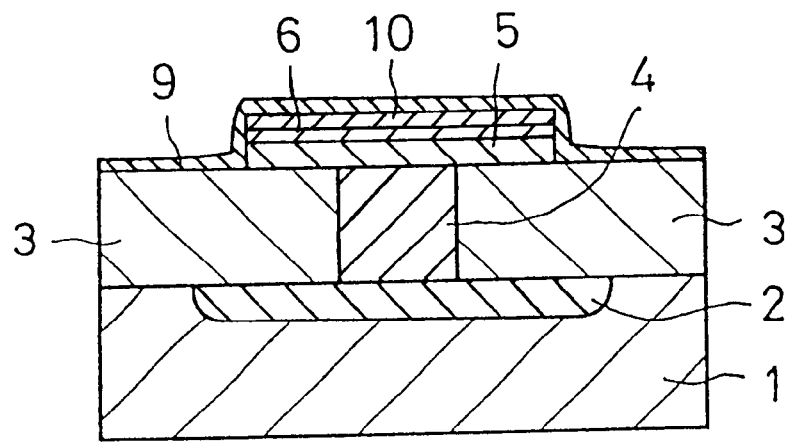

In the following step, as illustrated in FIG. 2(c), a heat treatment is performed on the dielectric initial layer (BST layer) 9 at a temperature within the range of 300~700 centigrade in a non-oxidizing atmosphere (e.g. N2). As a result, a transitional layer 10 is formed between the dielectric initial layer 9 and the lower electrode 6 even through the heat treatment has been performed at low temperature, to achieve a good interface state. It is to be noted that while the heat treatment may be implemented either in a heat treatment furnace or through rapid heating, it is more desirable to perform the heat treatment through rapid heating considering its advantage of preventing oxygen from becoming diffused to an excessive degree.

Figure 2D:
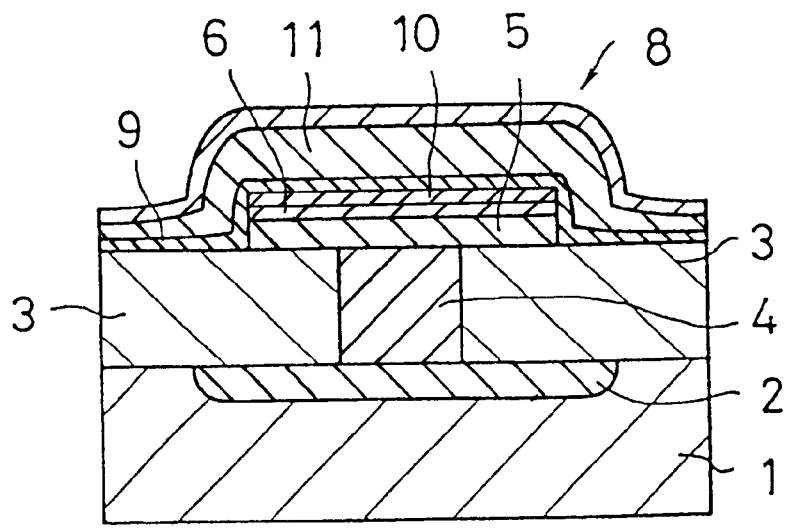

Then, as illustrated in FIG. 2(d), a second dielectric film (e.g., a BST film) 11 having a film thickness of 40 nm and a perovskite structure is formed through the film formation technologies such as sputtering and the CVD method, and a ruthenium-type upper electrode (e.g., Ru) 8 having a film thickness within the range of 50 nm~300 nm is formed through sputtering, to produce a complete DRAM capacitor structure. Subsequently, wiring, a passivation film and the like are formed through normal LSI processes to complete the DRAM product.

As explained above, since the elements constituting the dielectric initial layer 9 can be melded in at the lower electrode 6 by applying a high-frequency power to the silicon substrate 1 during the formation of the dielectric initial layer 9, a good transitional layer ($Ba_xSr_yRu_zTi_wO_3$ layer) 10 can be formed between the dielectric initial layer 9 and the lower electrode 6 even through a heat treatment is performed at low temperature in a non-oxidizing atmosphere. As a result, even when an extremely thin highly dielectric film is used, the leak current from the dielectric film is reduced to achieve good dielectric film characteristics. In addition, since the heat treatment can be performed at low temperature, the lower electrode 6 and the barrier metal 5 are never oxidized to an excessive degree, so that a good transitional layer 10 is assured. Furthermore, since the transitional layer 10 is formed through self-alignment on the lower electrode 6, the dry etching step may be omitted to achieve a simplification in the manufacturing process, which in turn, reduces production costs and improves the yield.

(Second Embodiment)

While the dielectric initial layer 9 is formed on the lower electrode 6, during the application of a high-frequency voltage to the silicon substrate 1 at which the lower electrode 6 has been formed in the first embodiment, a transitional layer 10 that is oxidized to a fuller degree can be formed by implementing this step in a state in which the oxygen concentration in the gas composition is increased by increasing the oxygen content in the dielectric initial layer 9. The following is a detailed explanation of the second embodiment in reference to FIG. 2.

First, as illustrated in FIG. 2(a), the manufacturing method in the prior art is adopted up to the step in which, with a contact hole formed at the n-type diffusion area 2 and a polycrystal silicon plug 4 formed by doping phosphorus within the contact hole, a capacitor ruthenium-type lower electrode 6 is formed, as in the first embodiment.

Next, a dielectric initial layer (e.g., a BST layer) 9 having a film thickness of 10 nm and a perovskite structure is formed on the lower electrode (e.g., Ru) 6 and the layer insulating film 3 by employing a film formation technology such as sputtering within a gas atmosphere in which the oxygen concentration in the gas composition ($O_2/(Ar+O_2)$) is increased by 20~100%. During this process, a high-frequency voltage is applied by the high-frequency source 20 to the silicon substrate 1, as in the first embodiment.

By increasing the oxygen concentration in the gas composition while forming the dielectric initial layer 9 in this manner, the oxygen content in the dielectric initial layer 9 can be increased. At the same time, since high-frequency power is applied to the silicon substrate 1, an $SrRuO_3$ film is formed during the initial stage of the formation of the dielectric initial layer 9 through the reverse sputtering phenomenon, as in the first embodiment. In other words, in this embodiment, the oxygen content in the meld area can be further increased compared to that in the meld area formed in the first embodiment.

In the next step, as illustrated in FIG. 2(c), a heat treatment is performed on the dielectric initial layer 9 at a temperature within the range of 300~700 centigrade in a non-oxidizing atmosphere (e.g., $N_2$). As a result, a transitional layer (a $Ba_xSr_yRu_zTi_wO_3$ layer) 10 is formed between the dielectric initial layer 9 and the lower electrode 6, and since the oxygen content is higher compared to that in the first embodiment, the transitional layer 10 is oxidized to a fuller degree to achieve an even better state for the interface of the dielectric initial layer 9 and the lower electrode 6. It is to be noted that while the heat treatment may be implemented either in a heat treatment furnace or through rapid heating, it is more desirable to perform the heat treatment through rapid heating considering its advantage of preventing oxygen from becoming diffused to an excessive degree.

Then, as illustrated in FIG. 2(d), a second dielectric film (e.g., a BST film) 11 having a film thickness of 40 nm and a perovskite structure is formed through the film formation technologies such as sputtering and the CVD method. Next, a ruthenium-type upper electrode (e.g., Ru) 8 with a film thickness of 50 nm~300 nm is formed through sputtering to complete the DRAM capacitor structure. Subsequently, wiring, a passivation film and the like are formed through normal LSI processes to complete the DRAM product.

In this embodiment featuring the structure described above, since the dielectric initial layer 9 is formed through a method similar to that employed in the first embodiment and also by increasing the oxygen concentration in the gas composition, the elements constituting the dielectric film initial layer 9 can be melded together at the lower electrode 6 while the content of oxygen in the dielectric initial layer 9 is increased. Thus, since oxygen can be supplied in a sufficient quantity from the dielectric film initial layer 9 even during the heat treatment which is performed in a non-oxidizing atmosphere, the transitional layer 10, which is oxidized to a fuller degree compared to that in the first embodiment, is achieved.

(Third Embodiment)

While the transitional layer 10, which is fully oxidized, is obtained by increasing the oxygen concentration in the gas composition and thus increasing the oxygen content within the dielectric initial layer 9 in the second embodiment, a transitional layer 10 that is fully oxidized may be also achieved by forming a conductive oxide film 12 between the lower electrode 6 and the dielectric initial layer 9. The following is an explanation of the third embodiment in reference to FIG. 6.

First, the manufacturing method in the prior art is adopted up to the step in which, with a contact hole formed in the n-type diffusion area 2, a polycrystal silicon plug 4 is formed by doping phosphorus in the contact hole, as in the first embodiment.

Figure 6A:
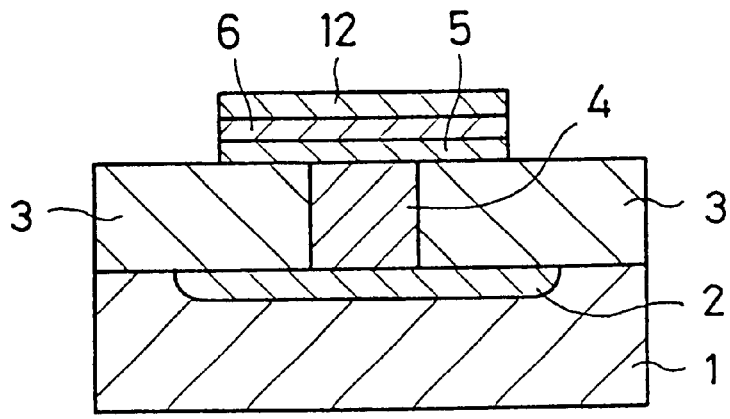
FIGS. 6(a)–6(d) present schematic cross sections illustrating the process for manufacturing a DRAM in a third embodiment of the present invention.

Next, as illustrated in FIG. 6(a), after depositing a barrier metal film (e.g., TiN) 5 through sputtering, a ruthenium-type lower electrode film (e.g., Ru) 6 is deposited through sputtering and then a conductive oxide film (e.g., $RuO_2$) 12 constituted of an oxide of the lower electrode 6 is deposited to a thickness of 10 nm through sputtering. The barrier metal 5, the lower electrode 6 and the conductive oxide film electrode 12 are then formed through photolithography and etching technologies.

Figure 6B:
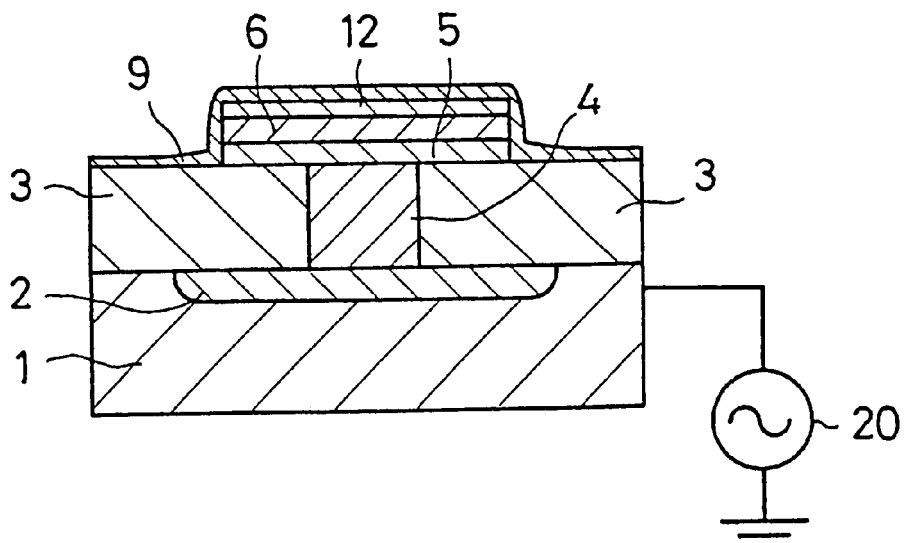

In the next step, as illustrated in FIG. 6(b), a dielectric initial layer (e.g., a BST layer) 9 having a film thickness of 10 nm and a perovskite structure is formed on the conductive oxide film 12 through the film formation technologies such as sputtering and the CVD method. During this step, a high-frequency voltage is applied by the high-frequency source 20 to the silicon substrate 1 while the dielectric initial layer 9 is being formed, as in the first embodiment.

Figure 6C:
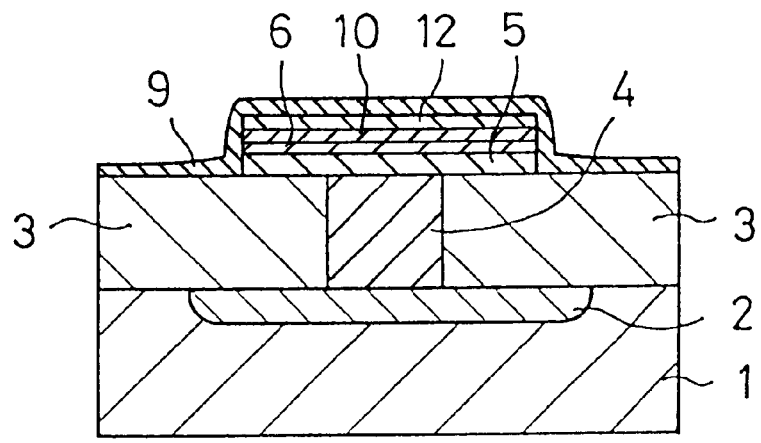

Namely, while the oxygen content in the dielectric initial layer 9 is increased in the second embodiment, the oxygen content is increased to the level required for the formation of a good interface by forming the conductive oxide film 12 between the lower electrode 6 and the dielectric initial layer 9 in this embodiment. Since the conductive oxide film (e.g., $RuO_2$) 12, which is an oxide of the lower electrode (e.g., Ru) is formed at the surface of the lower electrode 6 in this method, oxygen can be supplied to the interface from the conductive oxide film 12 even during the heat treatment performed in a non-oxidizing atmosphere, to achieve a transitional layer 10 as illustrated in FIG. 6(c) which is oxidized to a full extent. In addition, since a high-frequency voltage is applied to the silicon substrate 1 by the high-frequency source 20 during the formation of the dielectric initial layer 9, an $SrRuO_3$ film is formed during the initial stage of the formation of the dielectric initial layer 9 through the reverse sputtering phenomenon explained earlier.

In the following step, as illustrated in FIG. 6(c), a heat treatment is performed on the dielectric initial layer 9 at a temperature ranging from 300 to 700 centigrade in a non-oxidizing atmosphere (e.g., $N_2$). As a result, the transitional layer ($Ba_xSr_yRu_zTi_wO_3$ layer) 10 is formed between the dielectric initial layer 9 and the lower electrode 6, and since oxygen is supplied from the conductive oxide film 12 during the formation of the transitional layer 10, the transitional layer 10 is oxidized to a fuller degree compared to that achieved in the first embodiment, resulting in an improved state achieved for the interface of the dielectric initial layer 9 and the lower electrode 6. It is to be noted that while this heat treatment may be implemented either in a heat treatment furnace or through rapid heating, it is more desirable to perform the heat treatment through rapid heating considering its advantage of preventing oxygen from becoming diffused to an excessive degree.

Figure 6D:
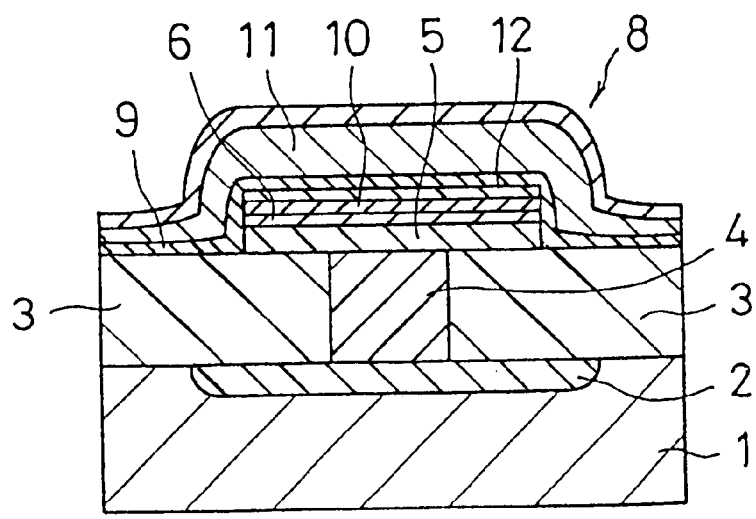

In the following step, as illustrated in FIG. 6(d), a second dielectric film (e.g., a BST film) 11 having a film thickness of 40 nm and a perovskite structure is formed by adopting the film formation technologies such as sputtering and the CVD method. Then, a ruthenium-type upper electrode (e.g. Ru) 8 having a film thickness of 50 nm~300 nm is formed through sputtering to complete the DRAM capacitor structure. Subsequently, wiring, a passivation film and the like are formed through normal LSI processes to complete the DRAM product.

This embodiment, which features the structure described above and in which the elements constituting the dielectric initial layer 9 are melded in after forming the conductive oxide film ($RuO_2$) of the lower electrode 6 between the lower electrode 6 and the dielectric initial film 9 to supply a sufficient quantity of oxygen from the conductive oxide film 12 even during the heat treatment performed in a non-oxidizing atmosphere, achieves the transitional layer 10 which is oxidized to an even fuller degree compared to that achieved in the first embodiment.

(Fourth Embodiment)

While a method of applying a high-frequency voltage to the silicon substrate 1 is adopted as a means for melding the elements constituting the dielectric initial layer 9 at the lower electrode 6 in the first embodiment, the elements constituting the dielectric initial layer 9 may be also melded at the lower electrode 6 by ion implanting the elements constituting the dielectric initial layer 9 at the surface of the lower electrode 6 through the ion implantation technology. The following is an explanation of the method for manufacturing a DRAM in the fourth embodiment, given in reference to FIG. 7.

Figure 7A:
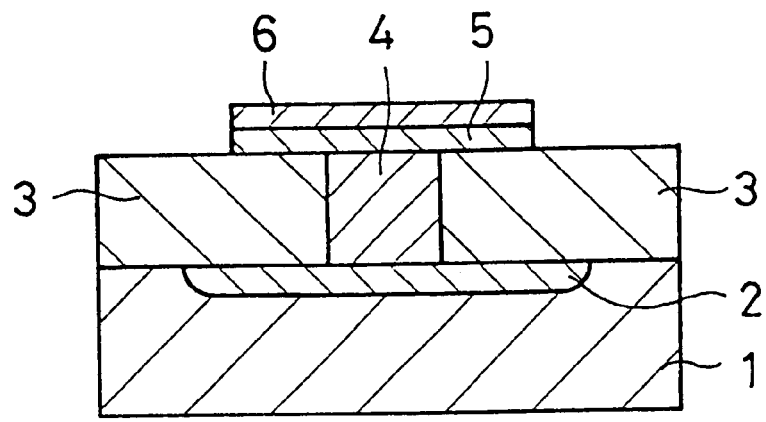
FIGS. 7(a)–7(d) present schematic cross sections illustrating the process for manufacturing a DRAM in a fourth embodiment of the present invention.

First, as illustrated in FIG. 7(a), the manufacturing method in the prior art is adopted up to the step in which a capacitor ruthenium-type lower electrode 6 and a barrier metal 5 are formed after forming a contact hole in the n-type diffusion area 2 and a polycrystal silicon plug 4 within the contact hole by doping with phosphorus, as in the first embodiment.

Figure 7B:
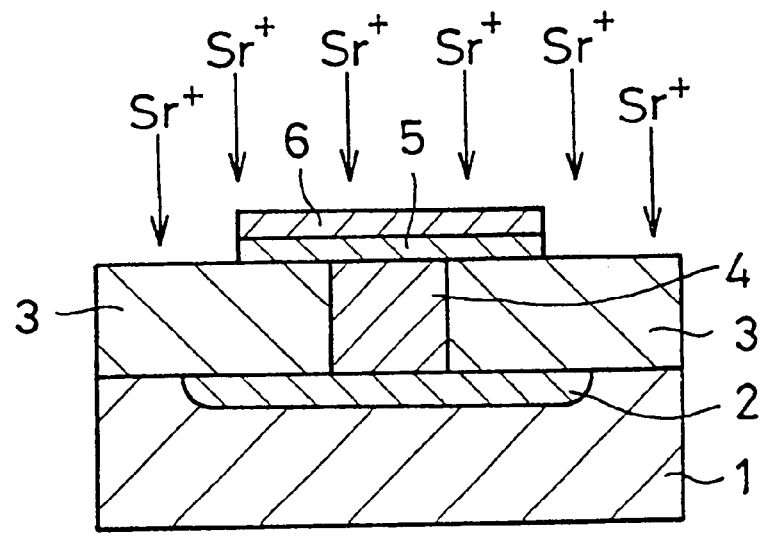

Next, as illustrated in FIG. 7(b), ion implantation of the elements constituting the dielectric initial layer 9 such as Sr ions is performed on the surface of the lower electrode (e.g., Ru) 6 at an accelerating voltage of 10~30 KeV and at a dope quantity of $10^{15} \sim 10^{18} \text{cm}^{-2}$ by adopting the ion implantation technology.

By melding the elements constituting the dielectric initial layer 9 on the surface of the lower electrode 6 through the ion implantation method in this manner, the elements constituting the dielectric initial layer 9 can be melded in large quantities into the surface of the lower electrode 6 with better control compared to the method in which a high-frequency voltage is applied to the silicon substrate 1 as in the first embodiment.

Figure 7C:
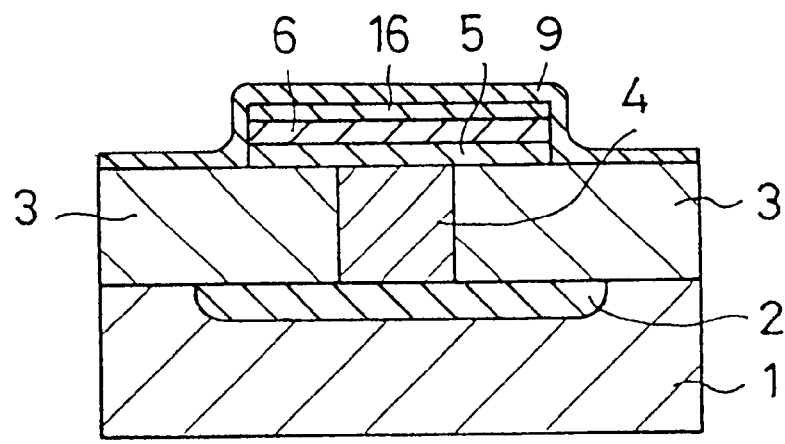

In the following step, as illustrated in FIG. 7(c), after forming the dielectric initial layer 9 (e.g. a BST layer) having a perovskite structure on the surface of the lower electrode 6, a heat treatment is performed at a temperature within the range of 300~700 centigrade in a non-oxidizing atmosphere (e.g. $N_2$). As a result, a transitional layer (a $Ba_xSr_yRu_zTi_wO_3$ layer) 16 is formed between the dielectric initial layer 9 and the lower electrode 6 to achieve an improved state for the interface of the dielectric initial layer 9 and the lower electrode 6. It is to be noted that while this heat treatment may be implemented either in a heat treatment furnace or through rapid heating, it is more desirable to perform the heat treatment through rapid heating considering its advantage of preventing oxygen from becoming diffused to an excessive degree.

Figure 7D:
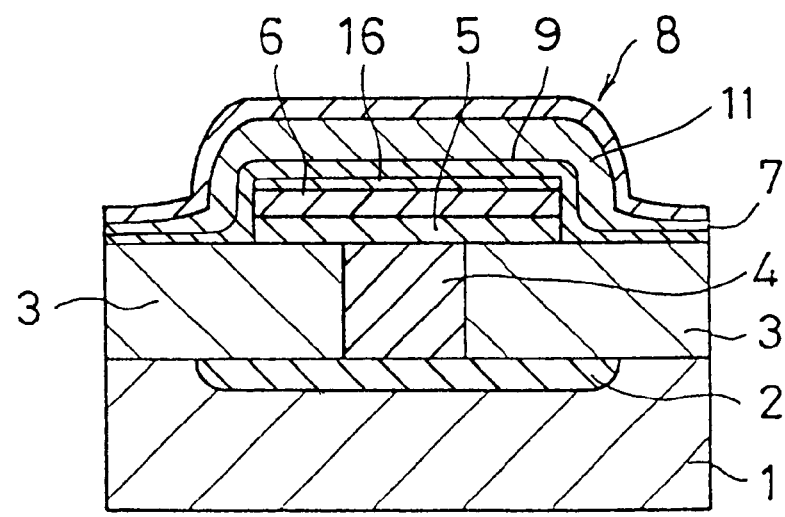

In the following step, as illustrated in FIG. 7(d), a second dielectric film (e.g., a BST layer) 11 having a film thickness of 40 nm and a perovskite structure is formed by adopting the film formation technologies such as sputtering and the CVD method. Then, a ruthenium-type upper electrode (e.g. Ru) 8 having a film thickness of 50 nm~300 nm is formed through sputtering to complete the DRAM capacitor structure. Subsequently, wiring, a passivation film and the like are formed through normal LSI processes to complete the DRAM product.

In this embodiment, which features the structure described above, the elements constituting the dielectric film initial layer 9 can be melded into the lower electrode 6 by melding the elements constituting the dielectric initial layer 9 at the surface of the lower electrode 6 through ion implantation technology. Consequently, the elements constituting the dielectric initial layer 9 can be melded into the surface of the lower electrode 6 in great quantities with better control compared to the method in which a high-frequency is applied to the silicon substrate 1 as in the first embodiment.

(Fifth Embodiment)

While the dielectric film characteristics are improved by improving the state of the interface of the dielectric initial layer 9 and the lower electrode 6 in the first embodiment through the fourth embodiment described earlier, a further improvement may be achieved in the dielectric film characteristics by improving the state of the interface of the second dielectric film 11 and the upper electrode 8. The following is an explanation of the fifth embodiment given in reference to FIG. 8.

Figure 8A:
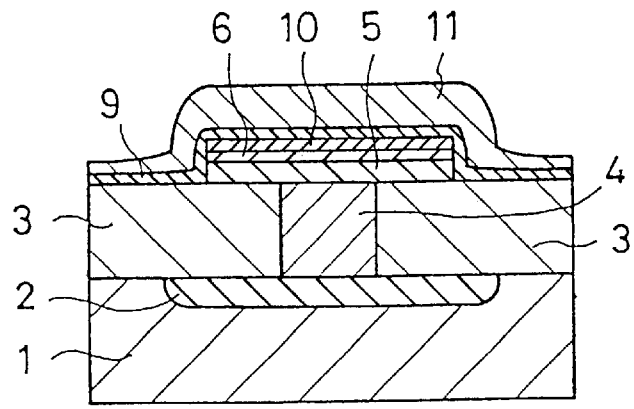
FIGS. 8(a)–8(c) present schematic cross sections illustrating the process for manufacturing a DRAM in a fifth embodiment of the present invention.

First, as illustrated in FIG. 8(a), manufacturing steps identical to those implemented in the first embodiment preceding the formation of the upper electrode, i.e., up to the step in which a second dielectric film 11 having a perovskite structure is formed following the formation of a contact hole at the n-type diffusion area 2, the formation of a polycrystal silicon plug 4 achieved by doping phosphorus within the contact hole, the formation of a capacitor ruthenium-type lower electrode 6, the formation of a dielectric initial layer 9 having a perovskite structure which is implemented while applying a high-frequency voltage to the silicon substrate 1 and the formation of a transitional layer 10 through a heat treatment performed in a non-oxidizing atmosphere, are carried out.

Figure 8B:
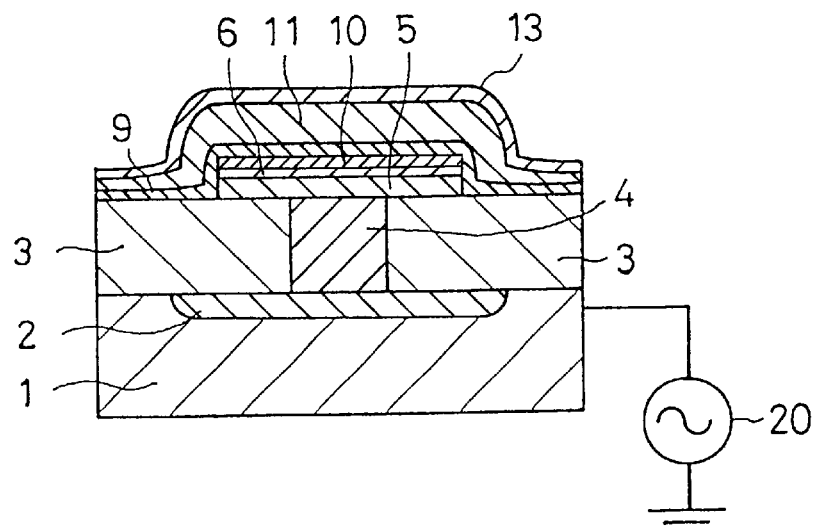

Next, as illustrated in FIG. 8(b), while applying a high-frequency voltage with the high-frequency source 20 to the silicon substrate 1 on which the treatment described above has been performed, a ruthenium-type upper electrode initial layer (e.g., Ru) 13 is deposited to a thickness of, for instance, 10 nm on the second dielectric film 11 formed on the silicon substrate 1 by employing a film formation technology such as sputtering. Then, a ruthenium-type second upper electrode film (e.g., Ru) 15 is formed without applying any high-frequency voltage.

As a high-frequency voltage is applied to the silicon substrate 1 to form the upper electrode initial layer 13 in this manner, a voltage that is negative relative to the plasma potential is applied toward the silicon substrate 1, resulting in Ar ions and O ions entering the silicon substrate 1. During this process, since the high-frequency voltage is applied in a state in which the lower electrode (e.g., Ru) 6 and the dielectric initial layer (e.g., a BST layer) 9 are reversed from the positions illustrated in reference to the first embodiment, Ba ions, Sr ions and Ti ions of the elements constituting the second dielectric film 11 enter the upper electrode initial layer 13. Thus, a state in which the elements constituting the second dielectric film 11 are melded at the upper electrode initial layer 13 is achieved.

Figure 8C:
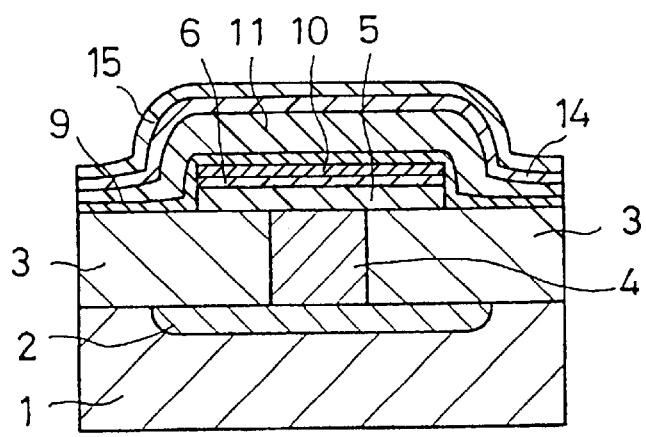

Next, as illustrated in FIG. 8(c), after the second upper electrode film (e.g., Ru) 15 is formed, a heat treatment is performed at a temperature within the range of 300~700 centigrade in a non-oxidizing atmosphere (e.g., $N_2$). As a result, a transitional layer 14 is formed between the second dielectric film 11 and the second upper electrode film 15 through the heat treatment performed at the low temperature to improve the state of the interface between the second dielectric layer 11 and the second upper electrode 15. It is to be noted that while this heat treatment may be implemented either in a heat treatment furnace or through rapid heating, it is more desirable to perform the heat treatment through rapid heating considering its advantage of preventing oxygen from becoming diffused to an excessive degree.

After a DRAM capacitor structure is completed in this manner, wiring, a passivation film and the like are formed through normal LSI processes to complete the DRAM product.

In this embodiment, which features the structure described above, a high-frequency voltage is applied to the silicon substrate 1 while forming the upper electrode initial layer 13 to cause Ar ions and O ions to enter the silicon substrate 1 and cause the elements constituting the dielectric film (Ba, Sr, Ti) to become melded into the upper electrode initial layer 13. Thus, the transitional layer 14 is formed between the second dielectric film 11 and the second upper electrode 15 even though the heat treatment is performed at a low temperature and in a non-oxidizing atmosphere, resulting in an improved state of the interface of the second dielectric film 13 and the second upper electrode 15. Consequently, in addition to the improvement in the state of the interface of the dielectric initial layer 9 and the lower electrode 6, an improvement is achieved in the state of the interface between the second dielectric film 11 and the second upper electrode 15, to further improve the dielectric film characteristics.

(Sixth Embodiment)

While the upper electrode initial layer 13 is formed while applying a high-frequency voltage to the silicon substrate 1 at which the second dielectric film has been formed in the fifth embodiment explained above, this step may be implemented in a state in which the oxygen concentration in the gas composition is increased by increasing the oxygen content at the upper electrode initial layer 13 so that a transitional layer 14 which is oxidized to a fuller degree is achieved. The following is an explanation of the sixth embodiment given in reference to FIG. 8.

First, as illustrated in FIG. 8(a), manufacturing steps identical to those implemented in the first embodiment preceding the formation of the upper electrode, i.e., up to the step in which a second dielectric film 11 having a perovskite structure is formed following the formation of a contact hole at the n-type diffusion area 2, the formation of a polycrystal silicon plug 4 achieved by doping phosphorus within the contact hole, the formation of a capacitor lower electrode 6, the formation of a dielectric initial layer 9 having a perovskite structure which is implemented while applying a high-frequency voltage to the silicon substrate 1 and the formation of a transitional layer through a heat treatment performed in a non-oxidizing atmosphere, are carried out.

Then, as illustrated in FIG. 8(b), a ruthenium-type upper electrode initial layer (e.g., Ru) 13 having a film thickness of 10 nm is formed by employing a film formation technology such as sputtering or the like on the second dielectric film (e.g., a BST film) 11 within a gas atmosphere in which the oxygen concentration in the gas composition ($O_2/(Ar+O_2)$) is increased by 20~100%. During this process, a high-frequency voltage is applied by the high-frequency source 20 to the silicon substrate 1 as in the fifth embodiment.

By increasing the oxygen concentration in the gas composition while forming the upper electrode initial layer 13 in this manner, too, the oxygen content in the upper electrode initial layer 13 can be increased. At the same time, since the high-frequency power is applied to the silicon substrate 1, an $SrRuO_3$ film is formed at the upper electrode initial layer 13 as in the fifth embodiment. In other words, in this embodiment, the oxygen content is further increased in the meld area compared with that in the fifth embodiment.

In the next step, as illustrated in FIG. 8(c), after forming a ruthenium-type second upper electrode film (e.g., Ru) 15, a heat treatment is performed at a temperature within the range of 300~700 centigrade in a non-oxidizing atmosphere (e.g., $N_2$). As a result, a transitional layer ($Ba_xSr_yRu_zTi_wO_3$ layer) 14 is formed between the second dielectric film (e.g., BST film) 11 and the second upper electrode film (e.g., Ru) 15, and since the oxygen content is increased compared to that in the fifth embodiment, the transitional layer 14 is oxidized to a fuller degree to improve the state of the interface of the second dielectric film 13 and the second upper electrode film 15. It is to be noted that while this heat treatment may be implemented either in a heat treatment furnace or through rapid heating, it is more desirable to perform the heat treatment through rapid heating considering its advantage of preventing oxygen from becoming diffused to an excessive degree.

A DRAM capacitor structure is thus completed, and subsequently, wiring, a passivation film and the like are formed through normal LSI processes to complete the DRAM product.

In this embodiment, which features the structure described above, the oxygen concentration in the gas composition is increased by forming the upper electrode initial layer 13 through a method similar to that employed in the fifth embodiment and, as a result, the elements constituting the second dielectric film 11 can be melded into the upper electrode initial layer 13 in a state in which the oxygen content in the upper electrode initial layer 13 is increased. Thus, a sufficient quantity of oxygen can be supplied from the upper electrode initial layer during the heat treatment performed in a non-oxidizing atmosphere to achieve a transitional layer 10 that is more thoroughly oxidized compared to that in the fifth embodiment.

(Seventh Embodiment)

While in the sixth embodiment above, a method in which a second meld area is formed by melding the elements constituting the second dielectric film 11 into the upper electrode initial layer 13 while applying a high-frequency voltage to the silicon substrate 1 is adopted, a second meld area may also be formed by performing ion implantation of the elements constituting the second upper electrode 15 at the surface of the second dielectric film 11 through the ion implantation technology. The following is an explanation of the seventh embodiment given in reference to FIG. 9.

Figure 9A:
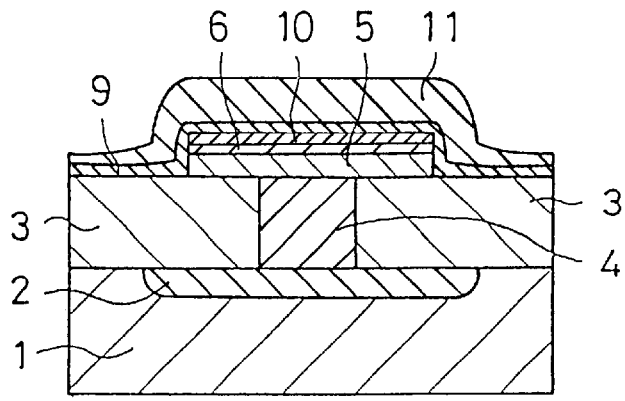
FIGS. 9(a)–9(c) present schematic cross sections illustrating the process for manufacturing a DRAM in a seventh embodiment of the present invention.

First, as illustrated in FIG. 9(a), manufacturing steps identical to those implemented in the first embodiment preceding the formation of the upper electrode, i.e., up to the step in which the second dielectric film 11 having a perovskite structure is formed following the formation of a contact hole at the n-type diffusion area 2, the formation of a polycrystal silicon plug 4 by doping phosphorus within the contact hole, the formation of a capacitor ruthenium-type lower electrode 6, the formation of a dielectric initial layer 9 having a perovskite structure which is implemented while applying a high-frequency voltage to the silicon substrate 1 and the formation of a transitional layer 10 through a heat treatment performed in a non-oxidizing atmosphere, are carried out.

Figure 9B:
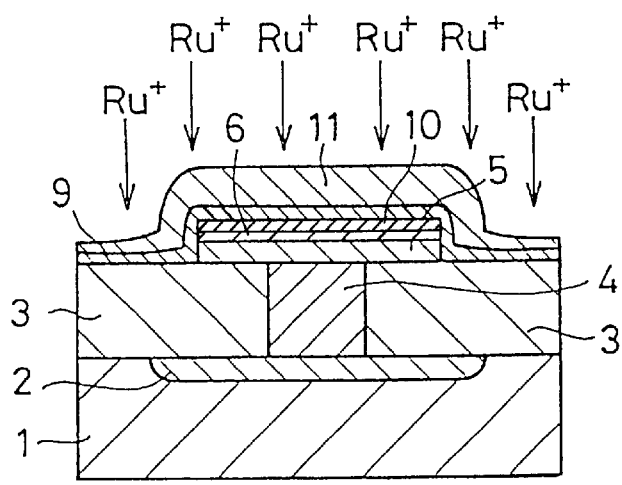

Next, as illustrated in FIG. 9(b), ion implantation of the elements constituting the ruthenium-type second upper electrode 15 is performed at the surface of the second dielectric film (e.g., a BST film) 11 by employing the ion implantation technology at an accelerating voltage of 10~30 KeV and at a doping quantity of $10^{15}$~$10^{18}$ $cm^{-2}$.

By melding the elements constituting the second upper electrode 15 to the second dielectric film (e.g., a BST film) 11 through the ion implantation method in this manner, the elements constituting the second upper electrode 15 can be melded into the surface of the second dielectric substance 11 in greater quantities with better control compared to the method in which a high-frequency voltage is applied to the silicon substrate 1, as in the fifth embodiment.

Figure 9C:
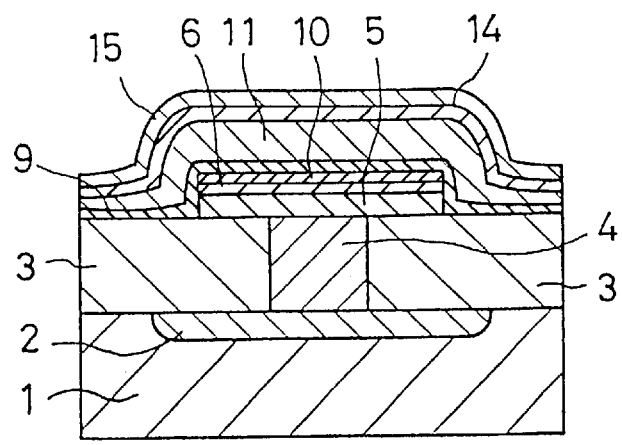
Figure 10A:
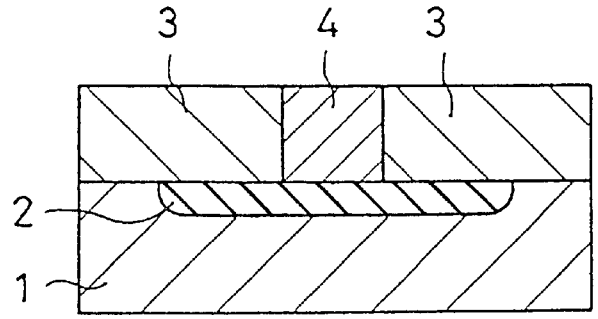
FIGS. 10(a)–10(c) present schematic cross sections illustrating a process for manufacturing a DRAM in the prior art.
Figure 10B:
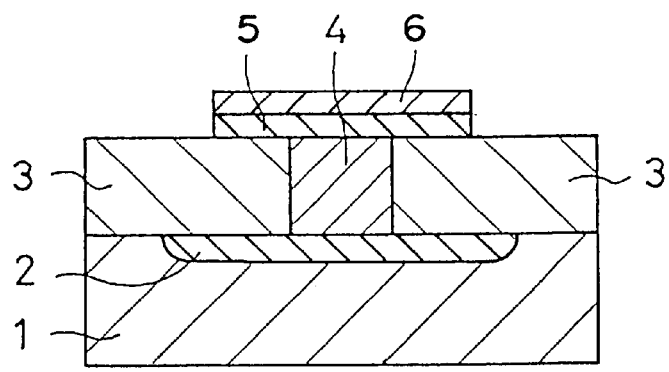
Figure 10C:
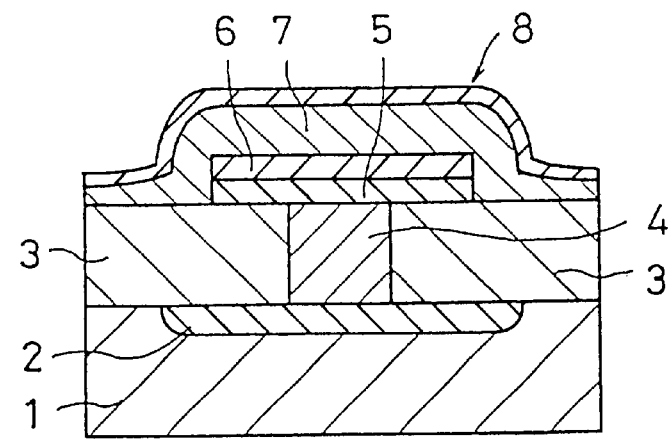
Figure 11A:
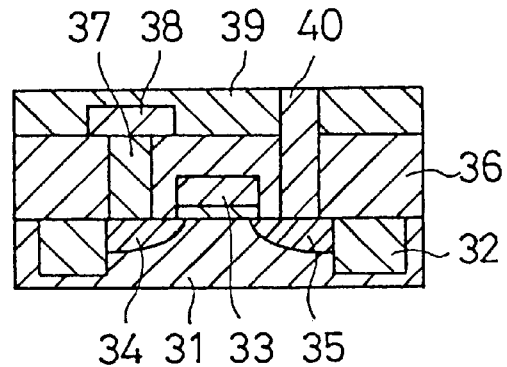
FIGS. 11(a)–11(e) present schematic cross sections illustrating a process for manufacturing a DRAM in the prior art.
Figure 11B:
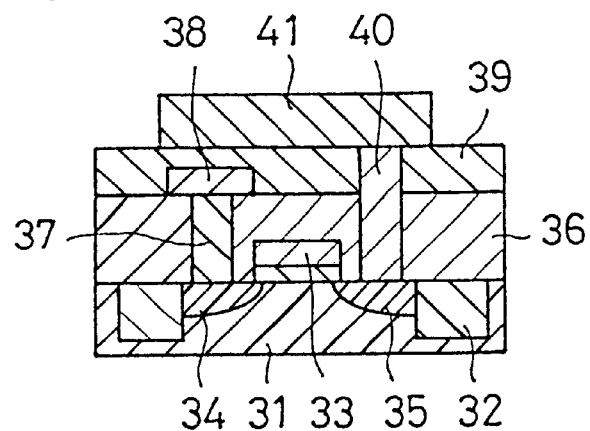
Figure 11C:
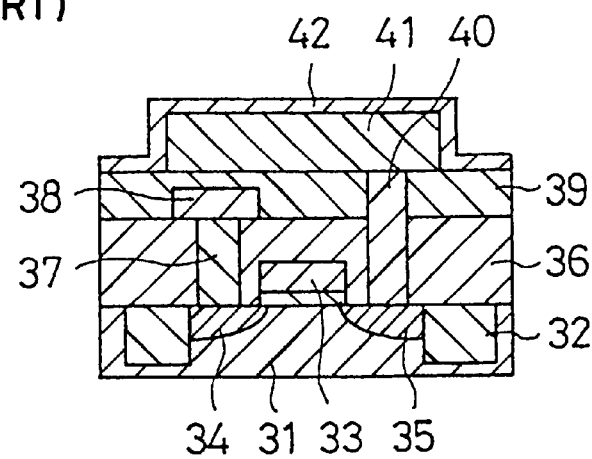
Figure 11D:
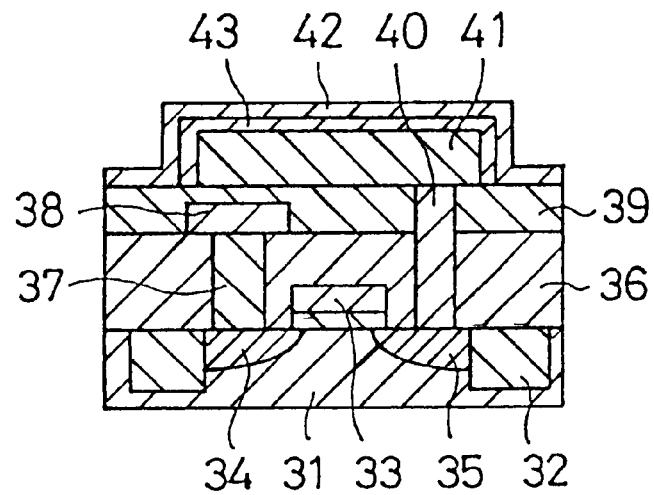
Figure 11E:
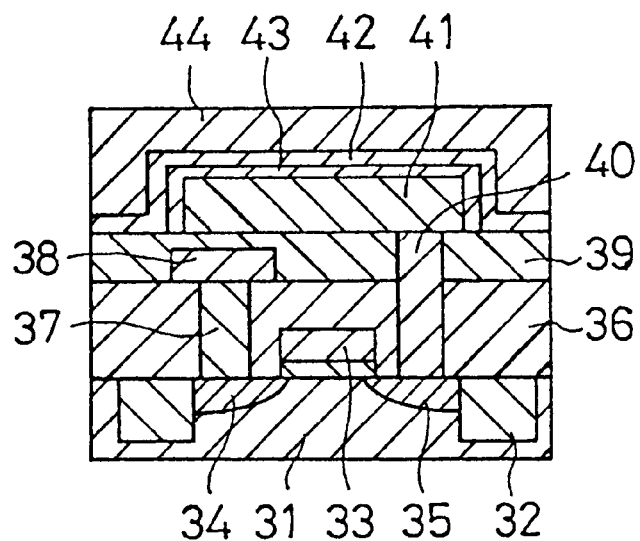

In the next step, as illustrated in FIG. 9(c), after forming the ruthenium-type second upper electrode film 15, a heat treatment is performed at a temperature within the range of 300~700 centigrade in a non-oxidizing atmosphere (e.g., $N_2$). As a result, the transitional layer 14 is formed between the second dielectric film (e.g., a BST film) 11 and the second upper electrode (e.g., RU) 15 through the heat treatment performed at a low temperature to improve the state of the interface of the second dielectric film 11 and the second upper electrode film 15. It is to be noted that while this heat treatment may be implemented either in a heat treatment furnace or through rapid heating, it is more desirable to perform the heat treatment through rapid heating considering its advantage of preventing oxygen from becoming diffused to an excessive degree.

Through this process, a DRAM capacitor structure is completed. Subsequently, wiring, a passivation film and the like are formed through normal LSI processes to complete the DRAM product.

In this embodiment, which features the structure described above, the elements constituting the second upper electrode film 15 can be melded into the surface of the second dielectric film 11 by melding the element constituting the second upper electrode film 15 at the surface of the second dielectric film 11 through the ion implantation technology. As a result, the elements constituting the second upper electrode film 15 can be melded into the surface of the second dielectric film 11 in great quantities with better control compared to the method in which a high-frequency voltage is applied to the silicon substrate 1, as in the fifth embodiment.

While preferred embodiments have been particularly shown and described with respect to the method for manufacturing a semiconductor device according to the present invention by referring to the attached drawings, the present invention is not limited to these examples and it will be understood by those skilled in the art that various changes in form and detail may be made therein without departing from the spirit, scope and teaching of the invention.

For instance, while a structural example in which a heat treatment is implemented at a temperature within the range of 300~700 centigrade in a non-oxidizing atmosphere is used to set the conditions for performing a heat treatment on a meld area in reference to the embodiments given earlier, the present invention is not restricted to this example, and depending upon the characteristics of the interface of the electrode and the highly dielectric film and factors such as the film thickness of the oxide film formed on the electrode and the like, the heat treatment temperature, the atmosphere, the length of time and the like can be set as appropriate.

In addition, while an example is used in the description of the preferred embodiments in which $N_2$ gas is used as the non-oxidizing gas in which the heat treatment of the meld area is performed, the present invention is not restricted to this example, and as long as the lower electrode and the barrier metal are not oxidized, the present invention can be implemented by using another inert gas such as Ar, He, Ne or the like. Consequently, the present invention can be carried out even within an oxidizing atmosphere when performing the heat treatment on the meld area as long as the heat treatment is implemented at a low temperature of, for instance, 500 centigrade or lower.

Also, while a structural example is used in reference to the embodiments described above in which the capacitor structure is completed after forming the meld area and then forming the transitional layer through heat treatment, the present invention is not restricted to this example, and it may be implemented by performing a batch heat treatment after forming the meld area and the capacitor structure.

Furthermore, while a structural example in which BST is used to constitute the dielectric film of the capacitor is explained in reference to the embodiments, the present invention is not restricted to this example, and the present invention can be implemented by using a dielectric film material with a high dielectric constant which contains an alkaline earth metal such as $SrTiO_3$, $BaTiO_3$, $Pb(Zr, Ti)O_3$, $SrBi_2TiO_3$ or the like as a main constituent. In addition, the present invention may be implemented by using a dielectric film constituted of $Ta_2O_5$ or the like instead of a dielectric material having a perovskite structure.

Moreover, while a structural example in which sputtering and the CVD method are adopted to form the dielectric film in the description of the embodiments, the present invention is not restricted to this example and the present invention may be implemented by employing the deposition method, the MBE method, the sol-gel method, the laser ablation method or the like.

In addition, while a structural example in which ruthenium (Ru) is used as an electrode material is used in the description of the embodiments given earlier, the present invention is not restricted to this example, and it may be implemented by using a conductive material containing a precious metal having a high melting point such as iridium (Ir), platinum (Pt) or the like as an electrode material or by using a compound such as titanium nitride (TiN), tungsten nitride (WN) or the like as an electrode material.

Furthermore, while a structural example in which the lower electrode film has a film thickness of 30 nm~500 nm, the dielectric initial layer has a film thickness of 10 nm, the second dielectric film has a film thickness of 40 nm and the upper electrode has a film thickness of 50 nm~300 nm is used in the explanation of the embodiments given earlier, the present invention is not restricted to this example and it may be implemented by varying conditions such as the high-frequency voltage to be applied to the substrate and the conditions of the heat treatment in correspondence to the film thicknesses of the individual dielectric substances and the film thicknesses of the individual electrodes.

Moreover, while the embodiments has been explained by using a structural example in which the semiconductor device adopting a capacitor structure is a DRAM, the present invention is not restricted to this example, and it may be carried out in any semiconductor device as long as it has a capacitor structure that employs a highly dielectric film as an insulating film, such as an FRAM.

According to the present invention, since a transitional layer ($Ba_xSr_yRu_zTi_wO_3$ layer) can be formed between the dielectric film having a perovskite structure and the ruthenium-type electrode through heat treatment performed within a non-oxidizing atmosphere at a low temperature, the lower electrode and the barrier metal do not become oxidized to an excessive degree, so that a good interface is achieved between the dielectric film and the electrode. As a result, even when an extremely thin, highly dielectric film is used, the leak current flowing from the dielectric film is reduced to achieve good dielectric film characteristics.

In addition, since the transitional layer can be formed on the lower electrode through self alignment by performing a heat treatment on the meld area formed in the lower electrode, the lower electrode can be formed easily without having to dry etch the transitional layer. As a result, the step for dry etching the transitional layer can be omitted to simplify the manufacturing process which, in turn, will reduce the production costs and improve the yield.

The entire disclosure of Japanese Patent Application No. 10-183692 filed on Jun. 30, 1998 including specification, claims, drawings and summary is incorporated herein by reference in its entirety.

What is claimed is:

1. A method for manufacturing a semiconductor device comprising:

forming a first conductive electrode on a semiconductor substrate;

forming a first dielectric film on the first conductive electrode by applying a high frequency voltage to the semiconductor substrate to achieve reverse sputtering, elements of the first dielectric film being melded with elements of the first conductive electrode in a first meld area at a surface of the first conductive electrode; and heat treating the first meld area to form a transitional layer between the first conductive electrode and the first dielectric film.

2. The method for manufacturing a semiconductor device according to claim 1, further comprising:

forming a second dielectric film on the first dielectric film;

forming an initial second conductive electrode on the second dielectric film by applying a high frequency voltage to the semiconductor substrate to achieve reverse sputtering, elements of the second dielectric film being melded with elements of the initial second conductive electrode at a second meld area at a surface of the initial second conductive electrode;

forming an additional second conductive electrode on the initial second conductive electrode; and heat treating the second meld area within a non-oxidizing atmosphere to form a second transitional layer between the second dielectric film and the additional second conductive electrode.

3. The method for manufacturing a semiconductor device according to claim 1, wherein the first dielectric film is a perovskite structure.

4. The method for manufacturing a semiconductor device according to claim 1, further comprising:

forming a second dielectric film on the first dielectric film;

implanting ions into the second dielectric film, to meld the ions into the second dielectric film to form a second meld area;

forming a second conductive electrode on the second dielectric film after said implanting; and heat treating the second conductive electrode to form a second transitional layer between the second dielectric film and the second conductive electrode.

5. The method for manufacturing a semiconductor device according to claim 4, wherein the ions are the same as an element of the second conductive electrode.

6. The method for manufacturing a semiconductor device of claim 1, the first conductive electrode being selected from a group of precious metals having high melting points including platinum, iridium and ruthenium, and the first dielectric film including barium, strontium and titanium and having a high dielectric constant.

7. The method for manufacturing a semiconductor device according to claim 1, wherein said forming a first dielectric film is implemented within an oxidizing atmosphere.

8. The method for manufacturing a semiconductor device according to claim 1, further comprising forming a first conductive oxide film on the first conductive electrode before forming a first dielectric film.

9. The method for manufacturing a semiconductor device according to claim 1, wherein said heat treating is implemented within a non-oxidizing atmosphere at a temperature within a range of 300°–700° C.

10. The method for manufacturing a semiconductor device according to claim 1, wherein said heat treating is implemented at a temperature of 500° C. or less within an oxidizing atmosphere.

11. The method for manufacturing a semiconductor device according to claim 2, wherein said forming an initial second conductive electrode is implemented within an oxidizing atmosphere.

12. A method for manufacturing a semiconductor device comprising:

forming a conductive electrode on a semiconductor substrate;

implanting ions into the conductive electrode, the ions being melded with elements of the conductive electrode in a meld area at a surface of the conductive electrode;

forming a dielectric layer on the conductive electrode after said implanting; and heat treating the dielectric layer to form a transitional layer between the dielectric layer and the conductive electrode, the ions being selected from a group of elements that comprise the dielectric layer, and said heat treating being implemented within a non-oxidizing atmosphere at a temperature within a range of 300–700° C.

13. A method for manufacturing a semiconductor device comprising:

forming a conductive electrode on a semiconductor substrate;

implanting ions into the conductive electrode, the ions being melded with elements of the conductive electrode in a meld area at a surface of the conductive electrode;

forming a dielectric layer on the conductive electrode after said implanting; and heat treating the dielectric layer to form a transitional layer between the dielectric layer and the conductive electrode, the ions being selected from a group of elements that comprise the dielectric layer, and said heat treating being implemented within an oxidizing atmosphere at a temperature of 500° C. or lower.

* * * * *